(12) United States Patent
Hsiao et al.

(10) Patent No.: US 10,171,074 B2
(45) Date of Patent: Jan. 1, 2019

(54) ELECTRONIC SYSTEM

(71) Applicant: Chicony Power Technology Co., Ltd., New Taipei (TW)

(72) Inventors: Yung-Hung Hsiao, New Taipei (TW); Cheng-Chang Hsiao, New Taipei (TW)

(73) Assignee: CHICONY POWER TECHNOLOGY CO., LTD., New Taipei (TW)

( * ) Notice: Subject to any disclaimer, the term of this patent is extended or adjusted under 35 U.S.C. 154(b) by 485 days.

(21) Appl. No.: 14/872,764

(22) Filed: Oct. 1, 2015

(65) Prior Publication Data
US 2017/0099047 A1     Apr. 6, 2017

(51) Int. Cl.
| | | |
|---|---|---|
| *H01H 47/00* | (2006.01) | |
| *H03K 17/30* | (2006.01) | |
| *H02M 7/04* | (2006.01) | |
| *H02M 1/44* | (2007.01) | |

(52) U.S. Cl.
CPC ............. *H03K 17/30* (2013.01); *H02M 1/44* (2013.01); *H02M 7/04* (2013.01)

(58) Field of Classification Search
CPC .......... H02J 1/102; H02M 1/44; H02M 3/285; H02M 7/04; H02M 2001/0032; H03K 17/30; Y02B 70/16
USPC ........................................................ 307/131
See application file for complete search history.

(56) References Cited

U.S. PATENT DOCUMENTS

| | | | |
|---|---|---|---|
| 2002/0030455 A1* | 3/2002 | Ghanem | G01R 31/2653 315/291 |
| 2005/0008146 A1 | 1/2005 | Chheda et al. | |
| 2009/0158070 A1 | 6/2009 | Gruendler | |
| 2009/0322083 A1* | 12/2009 | Wagoner | H02J 3/38 290/44 |
| 2010/0014330 A1 | 1/2010 | Chang et al. | |
| 2011/0025292 A1 | 2/2011 | Huang et al. | |
| 2015/0012151 A1* | 1/2015 | Park | G05B 15/02 700/298 |

FOREIGN PATENT DOCUMENTS

| | | |
|---|---|---|
| CN | 1925298 A | 3/2007 |
| CN | 104953804 A | 10/2010 |
| CN | 103001500 A | 3/2013 |
| CN | 204859010 U | 12/2015 |

(Continued)

*Primary Examiner* — Rexford Barnie
*Assistant Examiner* — Toan Vu
(74) *Attorney, Agent, or Firm* — Muncy, Geissler, Olds & Lowe, P.C.

(57) ABSTRACT

An electronic system is disclosed. The electronic system is electrically connected to an alternative current (AC) power and includes a switch and a parallel power conversion device. The parallel power conversion device includes a first power conversion module, a second power conversion module, and a driver. The first power conversion module is electrically connected to the AC power source and the switch, the second power conversion module is electrically connected to the AC power source, and the driver is electrically connected to the second power conversion module. When a current outputted from the first power conversion module is smaller than a specific vale, the driver makes the second power conversion module operate in a sleep mode to stop outputting current and to reduce level of outputting voltage.

8 Claims, 5 Drawing Sheets

(56) References Cited

FOREIGN PATENT DOCUMENTS

| EP | 2 821 883 A2 | 1/2015 |
|----|--------------|--------|
| JP | 2010246194 A | 10/2010 |
| TW | M 463466 U | 10/2013 |

* cited by examiner

ELECTRONIC SYSTEM

BACKGROUND OF THE INVENTION

Field of the Invention

The present invention relates to an electronic device, and in particular to an electronic device having multiple power conversion device electrically connected in parallel.

Description of Related Art

The switch power converter is one of the switch power supplies for generating power to electronic devices. For example, a DC-to-DC power converter is used for converting a DC power from a level to the other(s).

The commercial power converter is designated to meet the power required for operation of the electronic device under non-standby mode and standby mode, when the electronic device operates at non-standby mode or standby mode, it is easily for the power converter to pull up or draw the power outputted therefrom to meet the power required for operation of the electronic device. However, power output from the power converter while the electronic device operates at non-standby mode is a constant value, which means that no matter the electronic device is functioned under partial load (or called light load) condition or full load condition, the power converter provides the same power thereto. However, the power converter for consumer application operates at partial load condition for a relatively large part of their lifetime. While functioning in this operation mode, it is desirable to draw power from the mains supply at as low a level as is conveniently possible. Therefore it is desirable to use a power converter design for the power supply which operates with a high efficiency not only under standby mode, but also for non-standby mode, especially at partial load condition.

SUMMARY OF THE INVENTION

According to one aspect of the present disclosure, an electronic system includes a plurality of power conversion module electrically connected in parallel, and is configured to generate different powers to meet the power required for operation of the electronic device. Thus, overall power consumption of the parallel power conversion device can be reduced.

According to one aspect of the present disclosure, an electronic system electrically connected to an alternative current (AC) power source includes a switch and a parallel power conversion device. The parallel power conversion device includes a first power conversion module, a second power conversion module, and a driver. The first power conversion module is electrically connected to the AC power source and the switch, the second power conversion module is electrically connected to the AC power source, and the driver is electrically connected to the second power conversion module. The driver makes the second power conversion module operate in a sleep mode to stop outputting current and to reduce level of outputting voltage when a current outputted from the first power conversion module is smaller than a specific value.

The electronic system of the present disclosure is configured to generate different powers to meet the power required for operation of the electronic device. Thus, overall power consumption of the parallel power conversion device and the electronic system can be reduced.

BRIEF DESCRIPTION OF DRAWING

The features of the invention believed to be novel are set forth with particularity in the appended claims. The invention itself, however, may be best understood by reference to the following detailed description of the invention, which describes an exemplary embodiment of the invention, taken in conjunction with the accompanying drawings, in which:

DETAILED DESCRIPTION OF THE INVENTION

A preferred embodiment of the present invention will be described with reference to the drawings.

Figure 1:
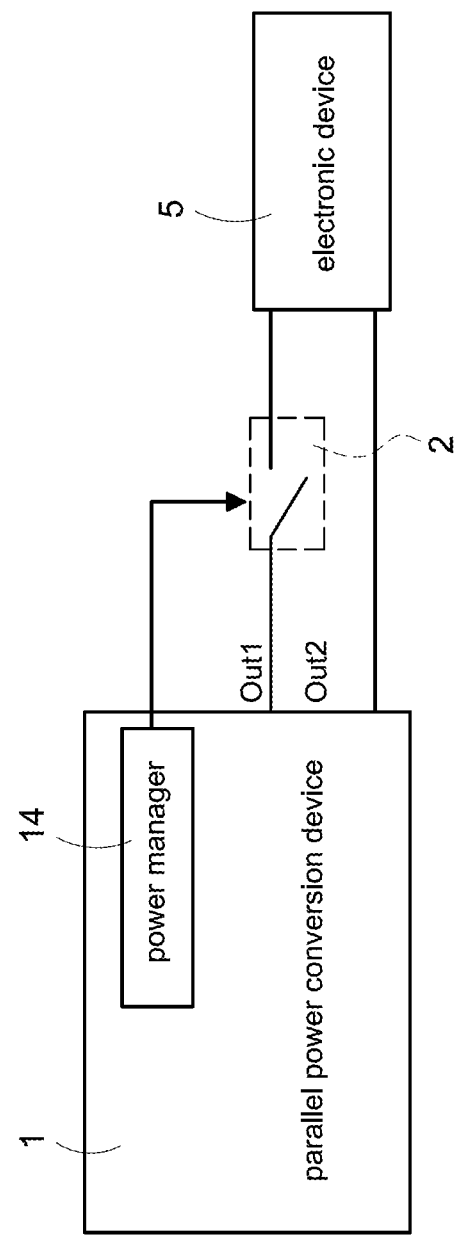
FIG. 1 is a circuit block diagram of an electronic device according to a first embodiment of the present disclosure.

Reference is made to FIG. 1, which is a circuit block diagram of an electronic system according to a first embodiment of the present invention. The electronic system includes a parallel power conversion device 1, a switch 2, and an electronic device 5. The parallel power conversion device 1 includes a first output Out1 and a second output Out2, the switch 2 is arranged between the first output Out1 and the electronic device 5. The parallel power conversion device 1 includes a power manager 14 configured to enable or disenable conduction of the switch 2. In particular, the switch 2 is switched on/off according to a signal sent from the power manager 14. When the switch 2 is switched off, there is no power being conducted to the electronic device 5 via the switch 2; however, when the switch 2 is switched on, there is a power being conducted to the electronic device 5 via the switch 2. The second output Out2 is electrically connected to the electronic device 5 directly (which means there is no switch coupled between the parallel power conversion device 1 and the electronic device 5), and the power from the parallel power conversion device 1 is directly transmitted to the electronic device 5.

Figure 2:
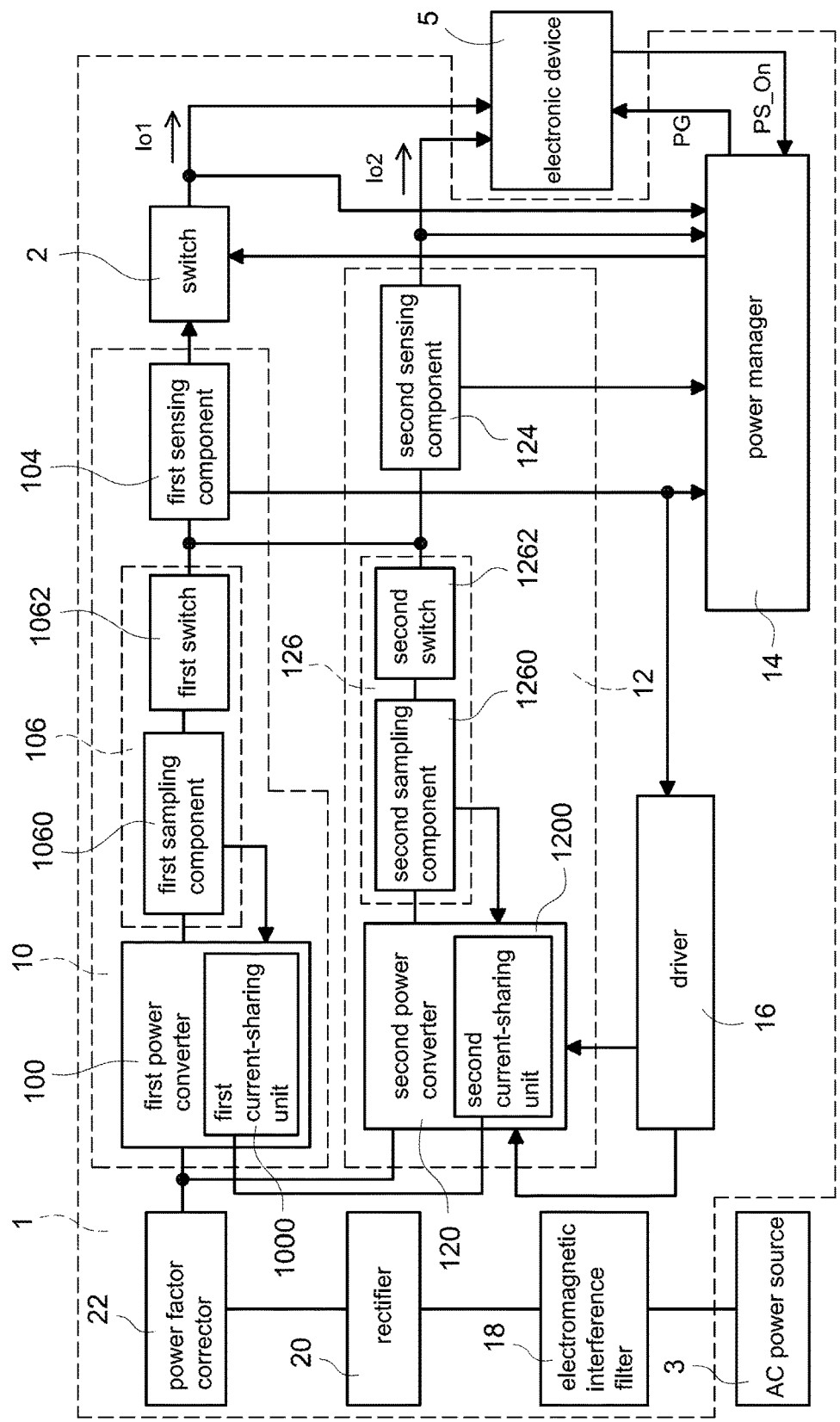
FIG. 2 is a circuit block diagram of an electronic device according to a second embodiment of the present disclosure.

Reference is made to FIG. 2, which is a circuit block diagram of an electronic system according to a second embodiment of the present invention. The parallel power conversion device 1 is arranged between the AC power source 3 and the electronic device 5, and is electrically connected to the AC power source 3 and the electronic device 5. The parallel power conversion device 1 is configured to convert AC power outputted from the AC power source 3 to direct current (DC) power.

In general, the electronic device 5 can be selected among a stop mode, a non-standby mode, and a standby mode. The stop mode is the operation mode in which the electronic device 5 electrically connected to the parallel power conversion device 1 stops all performing operations and/or executing instructions and makes for zero power consumption. In contrast, the non-standby mode is the operation mode in which the electronic device 5 electrically connected to the parallel power conversion device 1 performs operations and/or executes instructions. In particular, in the non-standby mode, the electronic device 5 can be further selected between a light load condition and non-light load condition based on an operating current required for operation. For example, the operating current required for operation of the electronic device 5 under non-light load condition is higher than that of under light load condition, and the light load condition is the condition in which the electronic device 5 is at half-load (or operates in a half maximum power). During standby mode, the electronic device 5 electrically connected to the parallel power conversion device 1 stops most of performing operations and/or executing instructions and remains performing operations and/or executing instructions for monitoring for occurrence of the wake-up signal. When the wake-up signal is received, the electronic device 5 is resumed and enters the non-standby mode. The parallel power conversion device 1 of the present disclosure has different power conversion manners while the electronic device 5 is operated in the non-standby mode and the standby mode, thus the overall power consumption of the electronic device 5 is effectively reduced.

The parallel power conversion device 1 includes a first power conversion module 10, a second power conversion module 12, a power manager 14, a driver 16, and a switch 2. The first power conversion module 10 is electrically connected to a power factor corrector 22 and includes a first output Out1 (as shown in FIG. 1). The second power conversion module 12 is electrically connected to the power factor corrector 22 and includes a second output Out2 (as shown in FIG. 1). The driver 16 is electrically connected to the first power conversion module 10 and the second power conversion module 12. The switch 2 is arranged between the first power conversion module 10 and the electronic device 5, and coupled to the first power conversion module 10, the power manager 14, and the electronic device 5. The switch 2 is switched on/off according to the signal outputted from the power manager 14.

The power manager 14 is electrically connected to the first power conversion module 10, the second power conversion module 12, the switch 2, and the electronic device 5, and is configured to detect the operation mode of the electronic device 5. As can be seen in FIG. 2, the power manager 14 has a signal outputting terminal PG and the signal receiving terminal PS_On, and both of the signal outputting terminal PG and the signal receiving terminal PS_On are electrically connected to the electronic device 5. In particular, the signal for transmitting to the electronic device 5 is outputted from signal outputting terminal PG of the power manager 14, and the signal sent by the electronic device 5 is received by the power manager 14 via the signal receiving terminal PS_On. Thus, the parallel power conversion device 1 can communicate with the power device 5.

When the electronic device 5 is under the non-light load condition, not only the power outputted from the first output Out1 of the first power conversion module 10 but also the power outputted from the second output Out2 of the second power conversion module 12 is transmitted to the electronic device 5. Besides, the operating current required for operation of the electrical device 5 under non-light load condition is averagely provided by the first power conversion module 10 and the second power conversion module 12. For example, when the operating current required for operation of the electronic device 5 under the non-light load condition is 1 ampere, the current output from the first output of first power conversion module 10 to the electronic device 5 is 0.5 amperes, and the current outputted from the second power conversion module 12 to the electronic device 5 is also 0.5 amperes.

When the electronic device 5 is under light load condition, the driver 16 makes the second power conversion module 12 enters a sleep mode to stop outputting current and to reduce level of outputting voltage for lowering power consumption.

When the electronic device 5 is in the standby mode, the driver 16 makes the second power conversion module 12 stop outputting current and reduce level of the outputting voltage to lower power consumption. In the meanwhile, the power manager 14 makes the switch 2 turn off, thus the power outputted from the first power conversion module 12 cannot transmit to the electronic device 5 via the switch 2.

The first power conversion module 10 includes a first power converter 100, a first sensing component 104, and a first current-sampling unit 106. The first power converter 100 is electrically connected to the AC power source 3 and includes a first current-sharing unit 1000. The first sensing component 104 is arranged between the first power converter 100 and the switch 2, and is electrically connected to the first power converter 100, the switch 2, and the power manager 14.

The first current-sampling unit 106 electrically connected to the first power converter 100 includes a first sampling component 1060 and a first switch 1062, and is configured to sensing a current outputted from the first power converter 100 and feedback the sensed current to the first current-sharing unit 1000. The first sampling component 1060 is electrically connected to the first current-sharing unit 1000. The first switch 1062 is electrically connected to the first sampling component 1060 and the first sensing component 104, and is configured to prevent the current outputted by the second power conversion module 12 from entering the first power conversion module 10. In particular, the first switch 1062 is selected between open (turn on) and close (turn off), and when the first switch 1062 is selected to be open, the current outputted from the second power conversion module 12 is isolated from the first power conversion module 10 to prevent the current outputted from the second power conversion module 12 from entering the first power conversion module 10.

The second power conversion module 12 includes a second power converter 120, a second sensing component 124, and a second current-sampling unit 126. The second power converter 120 is electrically connected to the AC power source 3 and includes a second current-sharing unit 1200 electrically connected to the first current-sharing unit 1000. The second sensing component 124 is arranged between the second power converter 120 and the electronic device 5, and is electrically connected to the second power converter 120, the power manager 14, and the electronic device 5.

The second current-sampling unit 126 electrically connected to the second power converter 120 includes a second sampling component 1260 and a second switch 1262, and is configured to sensing a current outputted from the second power converter 120 and feedback the sensed current to the second current-sharing unit 1200. The second sampling component 1260 is electrically connected to the second current-sharing unit 1200. The second switch 1262 is electrically connected to the second sampling component 1260 and the second sensing component 124, and is configured to prevent current outputted by the first power conversion module 10 from entering the second power conversion module 12. In particular, the second switch 1262 can be selected between open (turn on) and close (turn off), and when the second switch 1262 is selected to be open, the current outputted from the first power conversion module 10 is isolated from the second power conversion module 12 to prevent the current outputted from the first power conversion module 10 from entering the second power conversion module 12.

The first current-sharing unit 106 senses the current outputted from the first power converter 100 and feedback a signal corresponding to the sensed current to the first current-sharing unit 1000. The second current-sharing unit 126 senses the current outputted from the second power converter 120 and feedback a signal corresponding to the sensed current to the second current-sharing unit 1200. When the electronic device 5 under non-light condition, the operating current required for operation of the electrical device 5 is averagely provided by the first power conversion module 10 and the second power conversion module 12.

It should be noted that the first sampling component 1060 is not limited to be arranged between the first converter 100 and the electronic device 5, and the second sampling component 1260 is also not limited to be arranged between the second converter 120 and the electronic device 5. The first sampling component 1060 can be arranged between the AC power source 3 and the first power converter 100 and electrically connected thereto, and the second sampling component 1260 can be arranged between the AC power source 3 and the second power converter and electrically connected thereto.

Figure 3:
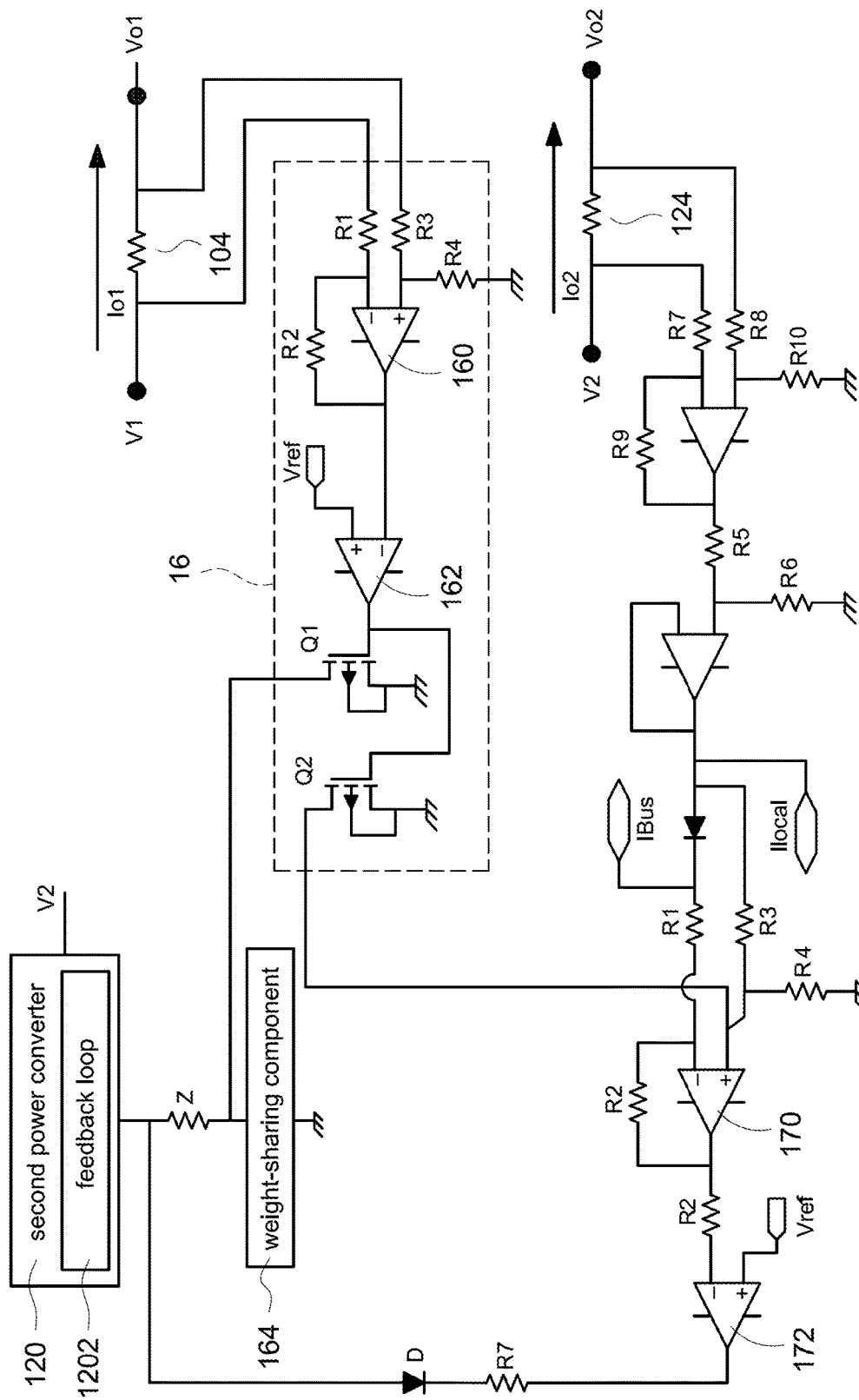
FIG. 3 is circuit diagram of the driver according to the first embodiment of the present disclosure.

Reference is made to FIG. 3 which shows a circuit diagram of the driver according to the present invention. The driver 16 includes an operational amplifier 160, a comparator 162, a first semiconductor switch Q1, and a second semiconductor switch Q2.

An inverting input of the operational amplifier 160 is electrically connected to an inverting input of the comparator 162 and an output of the operational amplifier 160 via the resistor R2, and is electrically connected to one terminal of the first sensing component 104 via a resistor R1. A non-inverting input of the operational amplifier 160 is not only electrically connected to the other terminal of the first sensing component 104 via resistor R3 but also electrically connected to ground via resistor R4.

An non-inverting input of the comparator 162 is electrically connected to a reference voltage Vref, and an output thereof is electrically connected to gates of the first semiconductor switch Q1 and the second semiconductor switch Q2. The drain of the first semiconductor switch Q1 is electrically connected to the weight-sharing component 164 electrically connected to the second power converter 120. When the comparator 162 output a low level signal, the first semiconductor switch Q1 is conducting (turning on) to lower the level of voltage outputted form the second power converter 120 by lowering the gain of the feedback loop 1202 of the second power converter 120. In should be noted that not only the second power converter 120 but also the first power converter 100 includes the feedback loop, the feedback loop of the first power converter 100 is configured to control the gain of the first converter 100, thus the level of the voltage and/or current outputted from the first power converter 120 is effectively controlled, and the feedback loop of the second power converter 120 is configured to control the gain of the second converter 120, thus the level of the voltage and/or current outputted from the second power converter 100 is effectively controlled.

The second switch Q2 is electrically connected to a non-inverting input of a operational amplifier 170, an output of the operational amplifier 170 is electrically connected the an inverting input of the comparator 172 via resistor R2, and an output of the comparator 172 is electrically connected to the second power convertor 120 via a diode D. During the comparator 162 outputs a low level signal, the operational amplifier 170 outputs a low level signal due to the second switch Q2 is conducting (turning on), and then the comparator 172 outputs a high level signal to reverse bias the diode D and no current is conducting to the second power converter 120. As such, the second power converter 120 stops outputting current and lowers the level of outputting voltage during no current is conducting thereto. In sum, the driver 16 stops outputting current and lowers the voltage outputted from the second power converter 120 during the current outputted flowing through the first sensing component 104 is lower than a specific value, thus the power consumption of the parallel power conversion device 1 under light load condition is reduced.

The parallel power conversion device 1 of the present invention is not limited to include only two power conversion modules (the first power conversion module 10 and the second power conversion module 12) electrically connected in parallel. However, the parallel power conversion device 1 may include more than two power conversion modules electrically connected in parallel, one of the power conversion modules is electrically connected to the switch 2, and the other power conversion modules are electrically connected to the driver 16. As such manner, the parallel power conversion device 1 conducts the particular power conversion module electrically connected to the switch 2 to output power to the electronic device 5 during the electronic device 5 is under the light load condition or in the standby mode. During the electronic device 5 is in the non-standby mode, the amount of the power conversion modules conducted by the driver 16 and outputting power to the electronic device 5 is increased while the operating current required for operation of the electronic device 5 is increased, and the current-sharing unit of each power conversion module make the current required for operation of the electronic device 5 equally generate by the power conversion module which is conducted by the driver 16.

With refer again to FIG. 2, the parallel power conversion device 1 further includes an electromagnetic interference filter 18, a rectifier 20, and the power factor corrector 22. The electromagnetic interference filter 18 is electrically connected to the AC power source 3 and is configured to filtering electromagnetic noise within AC power generated by the AC power source 3.

The rectifier 20 is electrically connected to the electromagnetic interference filter 18. The rectifier 20 is configured to rectify the AC power which the electromagnetic noise is filtered to a full-wave rectified power without power factor correction. The rectifier 20 is, for example, bridge-type rectifier.

The power factor corrector 22 is electrically connected to the rectifier 20, the first power conversion module 10, and the second power conversion module 12. The power factor corrector 22 is configured to ensure that the input current of the rectified power follows voltage of the rectified power in time and amplitude proportionally (i.e. the input voltage and current of the rectified power are maintained in phase relative to each other). The power factor corrector 22 can be an active type power factor corrector or a passive type power factor corrector, wherein the active type power factor corrector and the passive type power factor corrector are categorized based on whether active switch is included. The active type power factor corrector uses active switch and circuit for controlling the active switch automatically corrects the input current. In contrast, the passive type power factor corrector performs power factor correction with only passive components, such as capacitors and inductors, at the input to correct poor power factor. The passive power factor corrector includes simplicity, cost effectiveness especially at low power. The active type power factor corrector yields a power factor higher than that of the passive power factor corrector, thus the performance of the active type power factor corrector is better than that of the passive power factor corrector.

Figure 4:
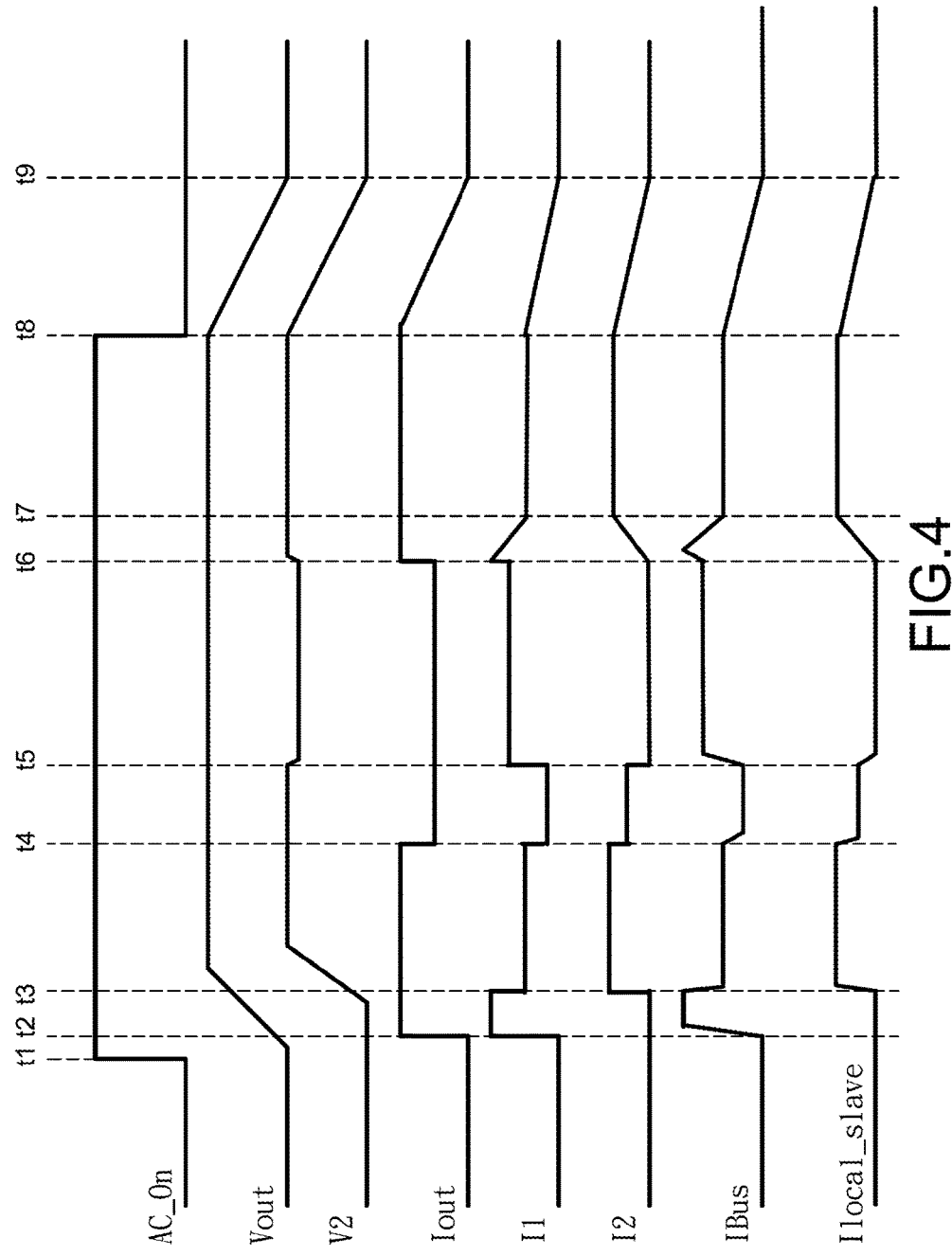
FIG. 4 is a timing diagram illustrating operations of the electronic system shown in FIG. 2.

Reference is made to FIG. 4. FIG. 4 is a timing diagram illustrating operations of the electronic system shown in FIG. 2. In this diagram, the signal AC_On represents the operations of the AC power source 3. The signal AC_On being at high level indicates that the AC power source 3 is activated. In contrast, the signal AC_On at low level indicates that the AC power source 3 in inactivated. The signal Vout represents the voltage outputted from the parallel power conversion device 1 (including the voltages outputted from the first power conversion module 10 and the second power conversion module 12). The signal V2 represents the voltage outputted from the second power conversion module 12. The signal Iout represents the current outputted from the parallel power conversion device 1 (including the first current Io1 shown in FIG. 2 outputted from the first power conversion module 10 and the second current Io2 shown in the FIG. 2 outputted from the second power conversion module 12). The signal I1 represents the current outputted from the first power converter 100, the signal I2 represents the current outputted from the second power converter 120, the signal IBus represents the current which simulated the current of the first current-sharing unit 1000 and the second current-sharing unit 1200, and the signal Ilocal2 represents the current transmitted from the second sampling component 1260 to the second current-sharing unit 1200.

The timing diagram of FIG. 4 is labeled at various points in time labeled t1 through t9. At an initial time t1, the AC power source 3 is activated since the signal AC_On is at high level. At time t2, the signal Iout is stepped from the initial low level to a high level, which indicates that there is a current being outputted from the parallel power conversion device 1 to the electronic device 5. It should be noted that the current outputted from the parallel power conversion device 1 at time t2 is provided by the first power converter 100 individually since the signal I1 is stepped from the initial low level to a high level and the signal I2 is keep in low level, and the amplitude of the signal I1 is the same as that of the signal Iout.

Between times t3 and t4 (the electronic device 5 is under non-light load condition), the signal I2 is stepped from the initial low level to a high level having a amplitude equal to the semi-amplitude of the signal Iout, and the signal I1 is stepped down to make its amplitude equal to the semi-amplitude of the signal Iout, wherein the semi-amplitude means half the peak-to-peak amplitude. This operating condition corresponds to a current sharing operation is occurred, and each of the first power converter 100 and the second power converter 120 share the operating current required for the electronic device 5 equally.

Between time t4 and t6, the electronic device 5 is under light load condition, the operating current required for the electronic device 5 is reduced. Therefore, the signal Iout is slightly stepped down (not equal to the initial low level). For example, the amplitude of the signal Iout between the t4 and t6 can be equal to the semi-amplitude of the signal Iout between time t3 and t4. Between times t4 and t5, the signals I1 and I2 are stepped down and sharing the operating current required for the electronic device 5 equally.

Between times t5 and t6, the parallel power conversion device 1 stops current sharing operation since the operating current required for the electronic device 5 is lower than a specific value. Thus the power consumption of the electronic device 5 under light load condition is reduced. When the parallel power conversion device 1 leaves current sharing operation, the second power converter 120 enters the sleep mode, the operating current required for the electronic device 5 is provided by the first power converter 100 individually, thus the signal I1 returns to the high level and the amplitude of the signal I1 is equal to that of the signal Iout. Since the second power converter 120 enters the sleep mode, the signal I2 returns to the low level.

At the time t6, the electronic device 5 backs to the non-light load condition, the operating current required for the electronic device 5 increases and the amplitude of the signal Iout and I1 increase accordingly. When the operating current required for the electronic device 5 is higher than or equal to the specific value, the parallel power conversion device 1 enters current sharing operation, then the second power converter is activated again, and the amplitude of the signal I1 is gradually decreased while the amplitude of the signal I2 is gradually increased. At time t7, the first power converter 100 and the second power converter 120 share the operating current required for the electronic device 5 equally.

At time t8, the signal AC_On returns to low level, which indicates that the AC power source 3 is inactivated. Between times t8 and t9, the signals Vout and V2 represent the voltage outputted from the parallel power conversion device 1 and the second power converter 120 are gradually decreased and back to the initial value (such as zero), and the signals Iout, I1 and I2 represent the currents outputted form the parallel power conversion device 1, the first power converter 100, and the second power converter 120 are gradually decrease accordingly.

Figure 5:
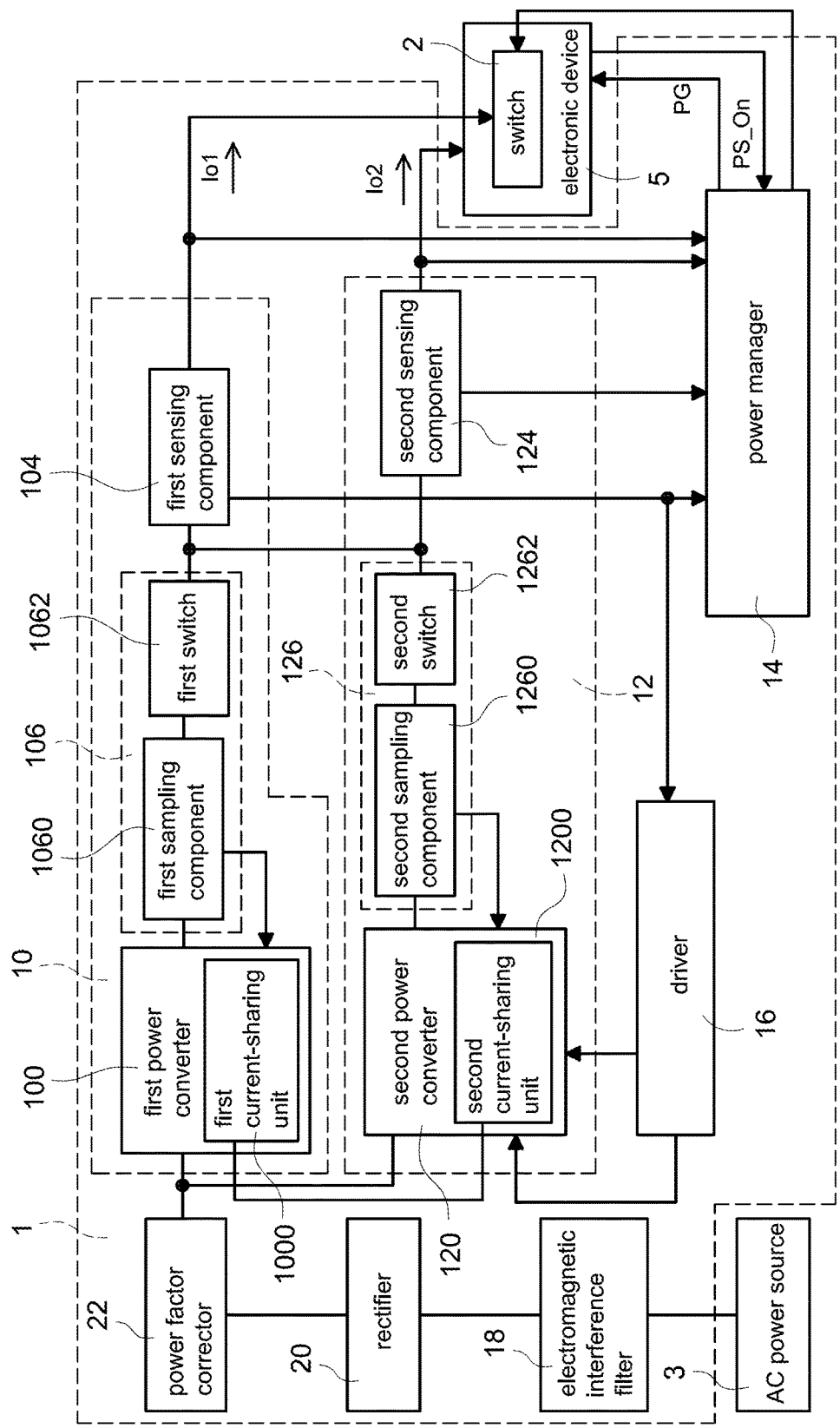
FIG. 5 is a circuit block diagram of an electronic device according to a third embodiment of the present disclosure.

Reference is made to FIG. 5, which is a circuit block diagram of an electronic system according to a third embodiment of the present invention. The electronic system of the third embodiment shown in FIG. 5 is similar to the electronic system of the second embodiment shown in FIG. 2. The difference between the electronic system shown in FIG. 2 and FIG. 5 is the allocation of the switch 2.

In FIG. 2, the switch 2 is arranged within the parallel power conversion device 2, and is switched on/off according to the signal outputted form the power manager 14 also arranged within the parallel power conversion module 1. The power manager 14 makes the switch 2 being switched on when the electronic device 5 is in the non-standby mode, thus the power outputted from the first power converter 100 is transmitted to the electronic device 5 via the switch 5. In contract, when the electronic device 5 is in the standby mode, the power manager 14 makes the switch 2 being switching off, thus the power outputted from the first power converter 100 cannot be transmitted to the electronic device 5 via the switch 2.

In the FIG. 5, the switch 2 is arranged within the electronic device 5, and is switched on/off according to the signal outputted form the power manager 14 arranged within the parallel power conversion module 1. In this manner, no matter the electronic device 5 is in the non-standby mode or in the standby mode, the power outputted from the first power converter 100 is transmitted to the electronic device 5. The power manager 14 electrically connected to the switch 2 measures whether the electronic device 5 is operated in the standby mode or not, and makes the switch 2 open when the electronic device 5 is operated in the standby mode to prevent power provided by the first power conversion module 10 and transmitted to the electronic device 5 from transmitting to other electronic components arranged in the electronic device 5. In contrast, the power manager 14 makes the switch 2 close when the electronic device 5 allow the power provided by the first power conversion module 10 and transmitted to the electronic device 5 passing through the switch 2 and transmitting to other electronic components arranged therein. The function and relative description of other components of the parallel power conversion device 1a of the third embodiment are the same as that of second embodiment mentioned above and are not repeated here for brevity, and the parallel power conversion device 1a can achieve the functions as the parallel power conversion device 1 does.

Although the present invention has been described with reference to the foregoing preferred embodiment, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. An electronic system electrically connected to an alternative current (AC) power source, the electronic system comprising:
   a switch; and
   a parallel power conversion device comprising:
      a first power conversion module electrically connected to the AC power source and the switch and comprising a first current-sampling unit and a first sensing component arranged between the first current-sampling unit and the switch;
   a second power conversion module electrically connected to the AC power source; and
   a driver electrically connected to the second power conversion module and comprising an amplifier electrically connected to the first sensing component, a comparator electrically connected to the amplifier, a first semiconductor switch electrically connected to the second power conversion module, and a second semiconductor switch electrically connected to the second power conversion module,
   wherein the driver makes the second power conversion module operate in a sleep mode to stop outputting a current and to reduce level of an outputting voltage when another current outputted from the first power conversion module is smaller than a specific value.

2. The electronic system in claim 1, wherein the first power conversion module further comprises a first power converter and a first current-sharing unit, the first current-sampling unit is electrically connected to the first power converter and the first current-sharing unit, the second power conversion module comprises a second power converter, a second current-sampling unit, and a second current-sharing unit, the second current-sampling unit is electrically connected to the second power converter and the second current-sharing unit, when the current outputted from the first power conversion module is larger than a specific value, the driver relieves the second power conversion module from operating in the sleep mode, the first current-sharing unit and the second current-sharing unit make a current outputted from the parallel power conversion module equally generate by the first power converter and the second power converter.

3. The electronic system in claim 2, wherein the outputting voltage outputted from the second power conversion module is not zero when the second converter is operated in the sleep mode.

4. The electronic system in claim 2, further comprising an electronic device electrically connected to the switch and the second power conversion module, the parallel power conversion device further comprises a power manager electrically connected to the first power conversion module, the second power conversion module, and the electronic device, the switch conducts or cuts off a power outputted from the first power conversion device according to controls of the power manager.

5. The electronic system in claim 4, wherein the first current-sampling unit comprises a first sampling component and a first switch electrically connected to each other, the first sampling component is arranged between the first power converter and the electronic device, the second current-sampling unit comprises a second sampling component and a second switch electrically connected to each other, the second sampling component is arranged between the second power converter and the electronic device.

6. The electronic system in claim 4, wherein the parallel power conversion device comprises the switch.

7. The electronic system in claim 4, wherein the electronic device comprises the switch.

8. The electronic system in claim 1, wherein the parallel power conversion device further comprises:
   an electromagnetic interference filter electrically connected to the AC power source;
   a rectifier electrically connected to the electromagnetic interference filter; and
   a power factor corrector electrically connected to the rectifier, the first power conversion module, and the second power conversion module.

* * * * *